United States Patent
Gogl et al.

(10) Patent No.: US 6,807,089 B2
(45) Date of Patent: Oct. 19, 2004

(54) METHOD FOR OPERATING AN MRAM SEMICONDUCTOR MEMORY CONFIGURATION

(75) Inventors: Dietmar Gogl, Essex Junction, VT (US); Till Schloesser, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/685,082

(22) Filed: Oct. 14, 2003

(65) Prior Publication Data

US 2004/0083328 A1 Apr. 29, 2004

Related U.S. Application Data

(63) Continuation of application No. PCT/DE02/01255, filed on Apr. 5, 2002.

(30) Foreign Application Priority Data

Apr. 11, 2001 (DE) .......................................... 101 18 196

(51) Int. Cl.[7] .......................... G11C 11/00; G11C 7/02; G11C 5/08; G11C 11/14; G11C 7/00

(52) U.S. Cl. ........................... 365/158; 365/55; 365/66; 365/171; 365/189.05; 365/189.07; 365/189.09; 365/193

(58) Field of Search ........................... 365/55, 66, 158, 365/171, 189.05, 189.07, 189.09, 193

(56) References Cited

U.S. PATENT DOCUMENTS

| | | |
|---|---|---|
| 5,703,805 A | 12/1997 | Tehrani et al. |
| 6,359,829 B1 | 3/2002 | Van Den Berg |

2003/0081475 A1 * 5/2003 Weber et al. ............... 365/200

FOREIGN PATENT DOCUMENTS

| | | |
|---|---|---|
| EP | 1 003 176 A2 | 5/2000 |
| JP | 2000187976 | 7/2000 |

OTHER PUBLICATIONS

Wang, Z. G. et al.: "Design, Simulation, and Realization of Solid State Memory Element Using the Weakly Coupled GMR Effect", IEEE Transactions on Magnetics, vol. 32, No. 2, Mar. 1996, pp. 520–526.
Zheng, Y. et al.: "Micromagnetic Principles in Pseudo Spin Valve Memory Element Design", IEEE Transactions on Magnetics, vol. 33, No. 5, Sep. 1997, pp. 3286–3288.
Wang, Z. et al.: "Quarternary Giant Magnetoresistance Random Access Memory", American Institute of Physics, J. Appl. Phys., vol. 79, No. 8, Apr. 15, 1996, pp. 6639–6641.
Wang, Z. G. et al.: "Feasibility of Ultra–Dense Spin–Tunneling Random Access Memory", IEEE Transactions on Magnetics, vol. 33, No. 6, Nov. 1997, pp. 4498–4512.

* cited by examiner

*Primary Examiner*—David Nelms
*Assistant Examiner*—Ly Duy Pham
(74) *Attorney, Agent, or Firm*—Laurence A. Greenberg; Werner H. Stemer; Ralph E. Locher

(57) ABSTRACT

In a method for operating an MRAM semiconductor memory configuration, for the purpose of reading an item of stored information, reversible magnetic changes are made to the TMR cell and a current that is momentarily altered as a result is compared with the original read signal. As a result, the TMR memory cell itself can serve as a reference, even though the information in the TMR memory cell is not destroyed, i.e. writing-back does not have to be effected. The method can preferably be applied to an MRAM memory configuration in which a plurality of TMR cells are connected, in parallel, to a selection transistor and in which there is a write line which is not electrically connected to the memory cell.

2 Claims, 1 Drawing Sheet

METHOD FOR OPERATING AN MRAM SEMICONDUCTOR MEMORY CONFIGURATION

CROSS-REFERENCE TO RELATED APPLICATION

This application is a continuation of copending International Application No. PCT/DE02/01255, filed Apr. 5, 2002, which designated the United States and was not published in English.

BACKGROUND OF THE INVENTION

Field of the Invention

The present invention relates to a method for operating an MRAM semiconductor memory configuration having a multiplicity of TMR memory cells, which, in a memory cell array, are connected to bit lines at one of their ends and to word lines at their other end.

As is known, an MRAM semiconductor memory configuration is based on ferromagnetic storage with the aid of the TMR effect. Located at a crossover point of a word line and a bit line is a TMR memory cell having a layer stack containing a soft-magnetic layer, a tunneling resistance layer and a hard-magnetic layer. Generally, the magnetization direction of the hard-magnetic layer is predetermined, while the magnetization direction of the soft-magnetic layer is adjustable by sending corresponding currents in specific directions through the word line and the bit line. With these currents, the soft-magnetic layer can be magnetized in a parallel or anti-parallel fashion with respect to the hard-magnetic layer. In the case of parallel magnetization, the resistance of the layer stack is lower than in the case of anti-parallel magnetization, which can be evaluated as the logic state "0" and "1", or vice versa. As an alternative, information can also be stored in the hard-magnetic layer, the soft-magnetic layer serving for the read-out. What is disadvantageous in this case, however, is that an increased write current is required for switching the magnetization of the hard-magnetic layer.

To date, essentially two architectures that differ from one another have been proposed for an MRAM semiconductor memory configuration.

In the so-called "crosspoint" construction, the individual TMR memory cells are located directly between mutually crossing interconnects which form bit and word lines. In the case of the crosspoint construction, no semiconductor components, and in particular no transistors, are required for the individual memory cells, so that a plurality of layers of TMR memory cells can readily be stacked one above the other. Very high integration densities can thus be achieved for an MRAM. However, in the case of such a "crosspoint" construction, parasitic currents inevitably flow via non-selected memory cells. Therefore, in large memory cell arrays, the individual TMR memory cells have to be furnished with a very high resistance in order that the parasitic currents can be kept low. The read operation is relatively slow on account of the high resistance of the individual TMR memory cells.

In the case of the other architecture, a switching or selection transistor is additionally assigned to each individual TMR memory cell with the above-mentioned layer stack (in this respect, see the reference by M. Durlam: entitled "Nonvolatile RAM based on Magnetic Tunnel Junction Elements").

The accompanying FIG. 1 shows diagrammatically and in perspective a section from four TMR memory cells TMR1, TMR2, TMR5, TMR6, which are respectively assigned a selection transistor TR11, TR12, TR21, TR22. As mentioned, each TMR memory cell contains a layer stack of the hard-magnetic layer 11, the tunneling resistance layer 12 and the soft-magnetic layer 13. Bit lines BL1 and BL2 form interconnects above the soft-magnetic layer 13 and are directly connected to the latter. Data or digit lines DL1 are disposed below the hard-magnetic layer 11 in a direction that crosses the bit lines BL1, BL2 and are connected to the layer. The selection transistor TR11, TR12, TR21 and TR22, whose gates are connected to word lines WL1 and WL2, is coupled to each TMR memory cell.

An MRAM semiconductor memory configuration having TMR memory cells that are connected to such switching transistors is distinguished by the fact that parasitic currents are practically precluded. As a result, even in large memory cell arrays, the memory cells can be provided with a lower resistance of the TMR element. Moreover, the reading method is simplified, thereby enabling a faster access than in the case of the "crosspoint" construction. However, the construction with transistor/TMR memory cells has the disadvantage that the dimensions are considerably larger compared with the crosspoint construction. In addition, it is not possible to perform direct stacking of TMR cell planes since a transistor and thus a silicon surface is required for each memory cell of a memory cell array.

In an earlier patent application, the present applicant proposed an MRAM memory configuration in which the advantages of a "crosspoint" construction are largely combined with the advantages of transistor/TMR memory cells.

The accompanying FIG. 2 shows such an MRAM semiconductor memory configuration that combines a crosspoint construction with a transistor/TMR memory cell construction. In this case, groups each containing a plurality of TMR memory cells are formed. The TMR memory cells TMR1, TMR2, TMR3 and TMR4 of a group are in each case jointly connected to a bit line BL by one of their ends and are jointly connected to a selection transistor TR1 at their other end, the word line 1 being connected to the gate of the transistor. In a further TMR memory cell group, likewise a plurality of TMR memory cells, for example four TMR memory cells TMR5, TMR6, TMR7 and TMR8, are jointly connected to the same bit line BL by one of their ends and are jointly connected to a second selection transistor TR2 by their other end, a second word line WL2 being connected to the gate terminal of the transistor TR2. In the case of the MRAM semiconductor memory configuration shown in FIG. 2, the space requirement for the transistors TR1, TR2 can be considerably reduced by virtue of the assignment of only one switching or selection transistor TR1, TR2 to in each case a plurality of TMR memory cells, for example four TMR memory cells, with the result that such an MRAM semiconductor memory configuration allows an increased packing density in the memory cell array.

Generally, there is the problem in MRAM semiconductor memory configurations that the reproducibility or the distribution of the resistances of the TMR memory cells can be realized inaccurately or can be unbalanced, since the resistances of the TMR memory cells depend extremely sensitively (exponentially) on the barrier thickness, i.e. the thickness of the tunnel layer. This makes it more difficult to realize an expedient reference for evaluation of the read signal. Essentially two possibilities have been discussed heretofore for solving this problem.

An external reference (reference cell or reference current/voltage source) is provided. For this, the TMR swing must be significantly larger than the fluctuations of the resistances. This method would be impossible for a memory configuration with a plurality of parallel TMR memory cells per transistor as described above.

During destructive reading, the TMR memory cell is subjected to rewriting after reading in a specific direction and thus compared; writing-back subsequently has to be effected. In this case, the memory cell itself serves as a reference, so that resistance fluctuations in the memory cell are unimportant. However, the method is time-consuming and leads to data alterations if the reading method is not 100% reliable. Since writing has to be effected more frequently, reliability problems can arise.

The reference by Wang et al.: entitled "Feasibility of Ultra-Dense Spin-Tunneling Random Access Memory", IEEE Transactions on Magnetics, Vol. 33, No. 6, Nov. 1997, pp. 4498–4512, discloses a method for operating an MRAM semiconductor memory configuration having a multiplicity of TMR memory cells, which, in a memory cell array, are connected to bit lines at one of their ends and to word lines at their other end. The magnetization of the soft-magnetic layer is situated in a first direction parallel to the easy magnetization axis, and afterward, by a current pulse through the electrically non-connected write line, the magnetization direction of the soft-magnetic layer is brought into a second direction exactly opposite to the first direction. From the change in the current signal through the memory cell, the stored information is determined during the change in the magnetization direction. In the course of reading the information stored in the TMR memory cell, the information is destroyed and therefore has to be written back after reading.

The reference by Wang et al: entitled "Quarternary Giant Magneto-resistance Random Access Memory", Journal of Applied Physics, Vol. 79, No. 8, Part 2B, Apr. 15, 1996, pp. 6639–6641, describes a read-out technique which does not destroy the information stored in the cell. In this case, the magnetic field generated by the read signal is intended to be lower than the coercivity of the soft-magnetic layer, as a result of which the magnetization of the soft-magnetic layer reverts to the original direction on account of its magnetic anisotropy.

SUMMARY OF THE INVENTION

It is accordingly an object of the invention to provide a method for operating an MRAM semiconductor memory configuration that overcomes the above-mentioned disadvantages of the prior art methods of this general type, in which the memory cell itself can serve as a reference and the information in the memory cell is not destroyed, i.e. that a writing-back does not have to be effected.

In accordance with one essential aspect, the method according to the invention is characterized in that the information is stored in the soft-magnetic layer of the TMR memory cell, and that, during reading, a current signal in the read line is initially detected without an externally applied magnetic field. Afterward, by a current pulse through the electrically non-connected write line, the magnetization of the soft-magnetic layer is reversibly rotated relative to the easy magnetization axis thereof, and the current signal that is altered as a result in the read line is compared with the initially detected current signal. The stored information is determined from this comparison.

In accordance with a second essential aspect, the method according to the invention is characterized in that the information is stored in the hard-magnetic layer of the TMR memory cell, and that, by a current pulse through the electrically non-connected write line, the soft-magnetic layer is brought into a defined direction parallel to the easy magnetization axis. The current signal that is altered as a result in the read line is subsequently measured. The measured value is compared with the current signal in the case of exactly the opposite orientation of the soft-magnetic layer. The stored information of the TMR memory cell is then determined from this comparison.

As a result, the memory cell itself can serve as a reference even though the information in the memory cell is not destroyed, i.e. writing-back does not have to be effected.

The method according to the invention can preferably be applied to a TMR memory cell type with a write line that is not electrically connected to the memory cell (for example the TMR memory cell plus transistor). Application to a pure crosspoint construction, i.e. a TMR memory cell without a transistor, is also possible, however.

The method according to the invention can be particularly advantageously applied to an above-described MRAM semiconductor memory configuration in which a plurality of TMR memory cells are connected, in parallel, to a selection transistor (see FIG. 2).

In accordance with an added mode of the invention, there is the step of setting a rotation of the magnetization of the soft-magnetic layer relative to the easy magnetization axis that is effected by the current pulse to about 45 to 60°.

Other features which are considered as characteristic for the invention are set forth in the appended claims.

Although the invention is illustrated and described herein as embodied in a method for operating an MRAM semiconductor memory configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
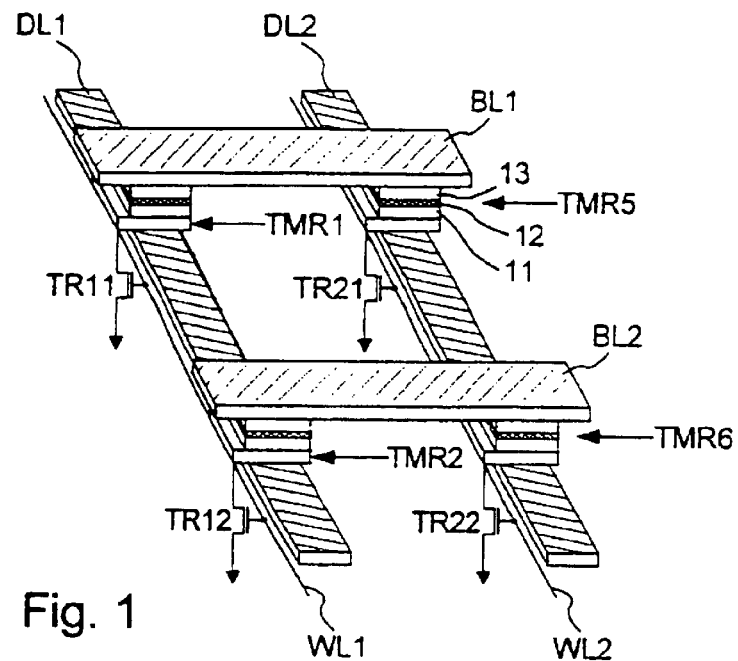
FIG. 1 is a diagrammatic, perspective view of an MRAM semiconductor memory configuration with a selection transistor assigned in each case to a TMR cell.
Figure 2:
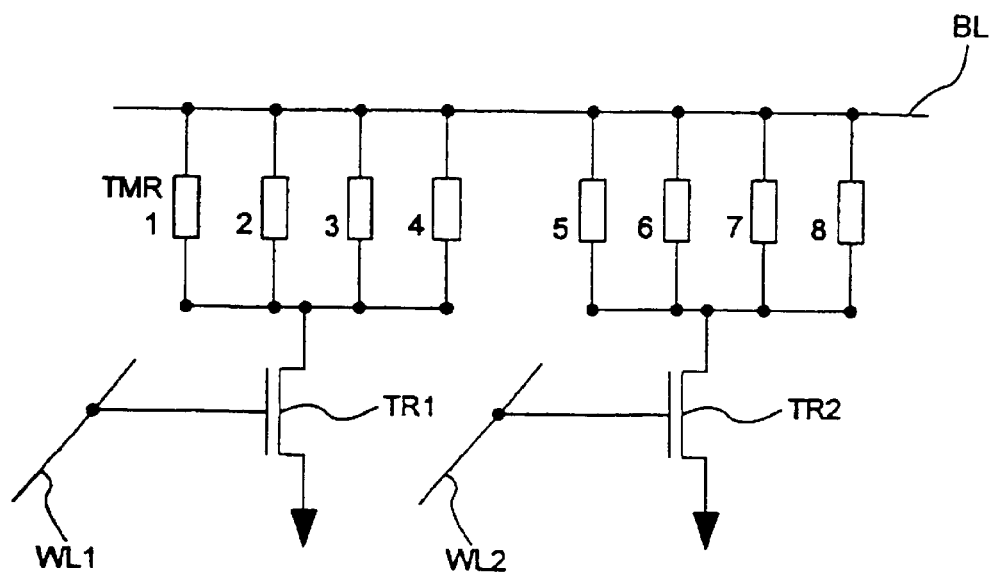
FIG. 2 is a schematic equivalent circuit diagram of the MRAM semiconductor memory configuration with a plurality of TMR cells connected, in parallel, to a selection transistor.

Referring now to the figures of the drawing in detail, FIGS. 1 and 2 are used for explaining first and second exemplary methods for operating the MRAM memory configuration.

In a first exemplary embodiment of the method according to the invention, information is stored in the soft-magnetic layer 13 (FIG. 1). During reading, the current signal corresponding to the information stored in the TMR memory cell is initially recorded without an externally applied magnetic field. Afterwards, the magnetization of the soft-magnetic layer 13 is rotated through approximately 45–60° relative to the easy magnetization axis (easy axis) by the field which is generated by a current pulse in the non-connected write line, e.g. WL2, and the current signal which is altered as a result is compared with the previously recorded current signal. If the magnetization of the soft-magnetic layer 13 was parallel with respect to the magnetization of the hard-magnetic layer 11 (for example corresponding to logic "0"), the resistance increases; if the magnetization of the soft-magnetic layer 13 was anti-parallel with respect to that of the hard-magnetic layer 11 (corresponding to logic "1"), the resistance decreases. Afterwards, on account of the magnetic anisotropy, the magnetization reverts in the original direction corresponding to the stored information. The exemplary embodiment of the method according to the invention thus enables the information stored in the cell to be read without the information being destroyed, the cell itself serving as reference. A disadvantage of this method, in comparison with destructive reading is a read signal that is at most a third as large.

In a second exemplary embodiment of the method according to the invention, the information is stored in the hard-magnetic layer 11. The soft-magnetic layer 13 serves for the read-out. By a current pulse through the electrically non-connected write line (for example WL2), the soft-magnetic layer is brought into a defined direction parallel to the easy axis and the measured value is compared with that in the case of exactly the opposite orientation of the soft-magnetic layer. The signal difference between logic "0" and "1" in this case corresponds at most to twice the TMR swing, i.e. it is six times higher than in the first exemplary embodiment. The information stored in the hard-magnetic layer 11 is not altered as a result of this. A disadvantage of this method is the higher write current required for switching the magnetization of the hard-magnetic layer.

We claim:

1. A method for operating an MRAM semiconductor memory configuration containing a memory cell array having a multiplicity of TMR memory cells with first ends connected to bit lines and second ends connected to word lines, which comprises the steps of:

storing information in a soft-magnetic layer of a respective TMR memory cell;

during reading, detecting an initial current signal in a respective bit line without an externally applied magnetic field;

afterwards, applying a current pulse through a respective electrically non-connected word line, to thereby reversibly rotate a magnetization of the soft-magnetic layer relative to an easy magnetization axis thereof and to form an altered current signal in the respective bit line;

comparing the altered current signal in the respective bit line with the initial current signal previously detected; and determining a content of the information stored from results of the comparing step.

2. The method according to claim 1, which further comprises setting a rotation of the magnetization of the soft-magnetic layer relative to the easy magnetization axis which is effected by the current pulse to about 45 to 60°.

* * * * *